(12) United States Patent
Krzeczowski et al.

(10) Patent No.: US 7,598,492 B1
(45) Date of Patent: Oct. 6, 2009

(54) CHARGED PARTICLE MICROSCOPY USING SUPER RESOLUTION

(75) Inventors: Kenneth J. Krzeczowski, Scotts Valley, CA (US); Mehran Nasser-Ghodsi, Hamilton, MA (US); Mathew H. Lent, Livermore, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 346 days.

(21) Appl. No.: 11/623,576

(22) Filed: Jan. 16, 2007

(51) Int. Cl.
*H01J 37/26* (2006.01)
*G01N 23/225* (2006.01)

(52) U.S. Cl. .................. 250/310; 250/307; 250/306; 250/309

(58) Field of Classification Search .............. 250/307, 250/310, 306, 309, 311
See application file for complete search history.

(56) References Cited

U.S. PATENT DOCUMENTS

| | | | | |
|---|---|---|---|---|
| 4,948,971 | A | * | 8/1990 | Vogen et al. ................. 250/310 |
| 5,814,814 | A | * | 9/1998 | Kanemitsu et al. .......... 250/310 |
| 6,043,490 | A | * | 3/2000 | Sakai .......................... 250/310 |
| 6,770,879 | B1 | * | 8/2004 | Azordegan et al. .......... 250/310 |
| 2007/0019887 | A1 | * | 1/2007 | Nestares et al. ............. 382/299 |

OTHER PUBLICATIONS

S. Farsiu: "Advances and Challenges in Super-Resolution", International Journal of Imaging Systems and Technology, Special Issue on High Resolution Image Rescontruction, vo. 14, pp. 47-57, Wiley Periodicals, Inc., 2004.

* cited by examiner

*Primary Examiner*—Jack I Berman
(74) *Attorney, Agent, or Firm*—Joshua D. Isenberg; JDI Patent

(57) ABSTRACT

A method for improving throughput in review of images from a charged particle beam microscopy tool and a charged particle beam microscopy tool are disclosed.

25 Claims, 5 Drawing Sheets

A

| | | | | | |
|---|---|---|---|---|---|
| $A_1$ | | $A_2$ | | $A_3$ | |
| | | | | | |
| $A_4$ | | $A_5$ | | $A_6$ | |
| | | | | | |
| $A_7$ | | $A_8$ | | $A_9$ | |
| | | | | | |

| | | | | | |
|---|---|---|---|---|---|
| | $B_1$ | | $B_2$ | | $B_3$ |
| | | | | | |
| | $B_4$ | | $B_5$ | | $B_6$ |
| | | | | | |
| | $B_7$ | | $B_8$ | | $B_9$ |
| | | | | | |

| | | | | | |
|---|---|---|---|---|---|
| | | | | | |
| $C_1$ | | $C_2$ | | $C_3$ | |
| | | | | | |
| $C_4$ | | $C_5$ | | $C_6$ | |
| | | | | | |
| $C_7$ | | $C_8$ | | $C_9$ | |

| | | | | | |
|---|---|---|---|---|---|
| | | | | | |
| | $D_1$ | | $D_2$ | | $D_3$ |
| | | | | | |
| | $D_4$ | | $D_5$ | | $D_6$ |
| | | | | | |
| | $D_7$ | | $D_8$ | | $D_9$ |

| | | | | | |
|---|---|---|---|---|---|
| | $E_1$ | | $E_2$ | | $E_3$ |
| | | | | | |
| | $E_4$ | | $E_5$ | | $E_6$ |
| | | | | | |
| | $E_7$ | | $E_8$ | | $E_9$ |
| | | | | | |

| | | | | | |
|---|---|---|---|---|---|
| | $F_1$ | | $F_2$ | | $F_3$ |
| | | | | | |
| | $F_4$ | | $F_5$ | | $F_6$ |
| | | | | | |
| | $F_7$ | | $F_8$ | | $F_9$ |
| | | | | | |

| $A_1$ | $B_1$ $E_1\ F_1$ | $A_2$ | $B_2$ $E_2\ F_2$ | $A_3$ | $B_3$ $E_3\ F_3$ |
|---|---|---|---|---|---|
| $C_1$ | $D_1$ | $C_2$ | $D_2$ | $C_3$ | $D_3$ |
| $A_4$ | $B_4$ $E_4\ F_4$ | $A_5$ | $B_5$ $E_5\ F_5$ | $A_6$ | $B_6$ $E_6\ F_6$ |
| $C_4$ | $D_3$ | $C_5$ | $D_5$ | $C_6$ | $D_6$ |
| $A_7$ | $B_7$ $E_7\ F_7$ | $A_8$ | $B_8$ $E_8\ F_8$ | $A_9$ | $B_9$ $E_9\ F_9$ |
| $C_7$ | $D_7$ | $C_8$ | $D_8$ | $C_9$ | $D_9$ |

FIG. 3

CHARGED PARTICLE MICROSCOPY USING SUPER RESOLUTION

FIELD OF THE INVENTION

This invention generally relates to substrate inspection and metrology and more particularly to improving resolution and throughput in charged particle beam microscopy.

BACKGROUND OF THE INVENTION

In charged particle beam microscopy (e.g., scanning electron microscopy) a probe beam of charged particles probes a target surface. Secondary particles are generated by interaction between the probe beam and the surface. The secondary particles may be detected and an image may be generated based on detection of the secondary particles. The images are typically built up in the form of pixels, wherein a pixel value in the image, e.g. a grey scale, is related to the intensity of secondary particles at a corresponding location on the target surface. In the prior art, the resolution of charged particle beam microscope images has been partly dependent on the stability of the surface being probed. Most imaging techniques rely to some degree or another on the assumption that the target does not move relative to the probe beam in a plane parallel to the surface. In practice, some degree of vibration of the target surface may be present. For low resolution images, i.e., images having pixel spacing greater than the amplitude of vibration of the target, the vibration amplitude is typically small enough that it does not significantly affect the image. However, resolution may be detrimentally affected if the pixel spacing is comparable to the vibration amplitude.

The field of view of a charged particle microscopy system may be limited. In order to obtain images covering an entire target surface it is often necessary to move the target in order to image different locations on the surface. Such movement of the target may induce vibration of the surface. To overcome the effects of target vibration, modern charged particle microscopy systems often make use of complex and expensive vibration damping for the stage that holds the target. Such damping can significantly increase the cost of a microscopy system. In addition, damping equipment often requires a period of time for vibration of the stage to settle out following movement of the target between images. This settling time reduces the rate at which images of a target can be acquired and decreases the throughput of the charged particle microscope system.

It is within this context that embodiments of the present invention arise.

BRIEF DESCRIPTION OF THE DRAWINGS

Objects and advantages of the invention will become apparent upon reading the following detailed description and upon reference to the accompanying drawings in which:

FIGS. 2A-2F are a series of schematic diagrams showing a series of multiple low resolution images used to form a super resolution image according to an embodiment of the present invention.

FIG. 3 is a schematic diagram illustrating a stitching together of the low resolution images of FIGS. 2A-2F to form a super resolution image according to an embodiment of the present invention.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1:
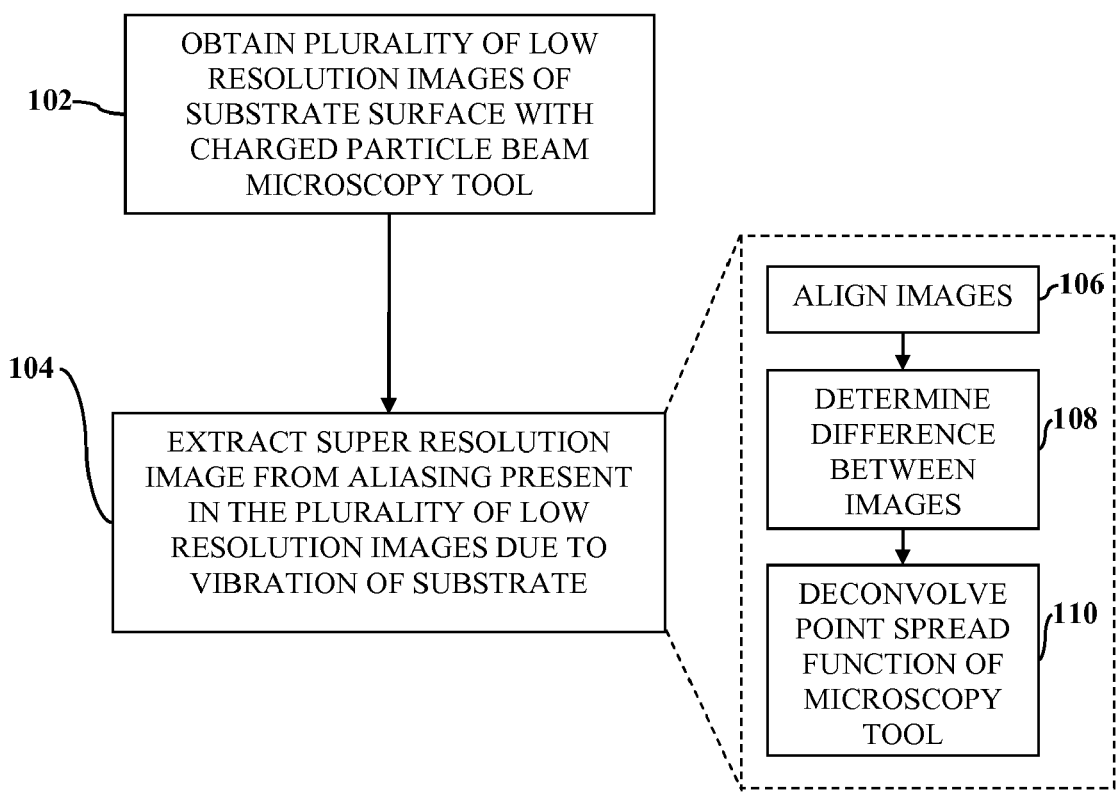
FIG. 1 is a flow diagram illustrating a method for improving throughput in review of images from a charged particle beam microscopy tool.

FIG. 1 depicts a flow diagram illustrating an example of a method 100 for improving throughput in review of images from a charged particle beam microscopy tool. In general, the method involves obtaining a plurality of low resolution images of a surface of a substrate with a charged particle beam microscopy tool as indicated at 102. The charged particle beam microscopy tool probes the surface of the substrate with a probe beam of charged particles and low resolution images are obtained from secondary charged particles generated by an interaction between the probe beam and the surface. An example of operation of a charged particle beam microscopy tool may be understood by reference to FIGS. 5A-5B below.

A super resolution image of the surface is produced by extracting the super resolution image from aliasing present in the plurality of low resolution images due to vibration of the substrate as indicated at 104. Various techniques for extracting super resolution images from a plurality of low resolution images are described, e.g., by S. Farsiu "Advances and Challenges in Super-Resolution", *International Journal of Imaging Systems and Technology, Special Issue on High Resolution Image Reconstruction*, Vol. 14 2 47-57, Wiley Periodicals, Inc. 2004, which is incorporated herein by reference.

Embodiments of the present invention may utilize a super-resolution imaging technique that takes advantage of extra image information provided as a result of vibrational movement of the substrate to produce an image with increased resolution. As used herein the term super-resolution refers to an image processing technique in which a series of low-resolution images are converted into a single high-resolution image. To implement super-resolution processing of the low resolution images according to embodiments of the invention it is actually desirable that there be some degree of vibration of the object being imaged that results in aliasing of the low resolution images.

As used herein and as commonly understood in statistics, signal processing, and related disciplines, the term aliasing refers an effect that causes different continuous signals to become indistinguishable (or aliases of one another) when sampled. The presence or absence of aliasing in the images may be determined from the Nyquist criterion. In general, aliasing will be present if the sample rate for the images is less than twice the highest frequency of variation in the pixels making up the images. As a practical matter, this means that the low resolution images may be obtained at a sampling rate (in images per unit time) that is less than twice the frequency of vibration of the object being imaged (in vibration cycles per unit time).

In general, the super resolution image comprises a plurality of pixels obtained from the two or more low resolution images. It is desirable for the probe beam to have a cross-sectional size at the target that is less than a characteristic size of the pixels that make up the super resolution image. The charged particle beam microscopy tool typically includes a stage for supporting the substrate. The stage is typically subject to vibration that is transmitted to the substrate. Unlike prior art techniques, where vibration is undesirable and expensive and time consuming measures are often taken to dampen vibration, embodiments of the present invention rely on aliasing in the low resolution images that is present because of the vibration. Consequently, a degree vibration that would be unacceptable in the prior art is actually desirable in embodiments of the present invention. Through the use of super resolution techniques, the low resolution images of the substrate may be obtained without waiting for the stage to settle.

There are a number of different super resolution techniques that may be used at 104. By way of example, one of the low resolution images may be aligned with another low resolution image as indicated at 106. A difference between two or more of the low resolution images may be used to produce an intermediate image as indicated at 108. By way of example, the difference between the low resolution images may be determined by performing a high resolution shift-and-add operation involving two or more of the images.

A shift-and-add operation (sometimes referred to as an "image-stacking" method) is a form of speckle imaging commonly used for obtaining high quality images from a number of short exposures with varying image shifts. It has been used in astronomy for several decades, and is the basis for the image-stabilization feature on some cameras. This technique involves calculation of the differential shifts of the images. The images are then shifted back to a common centre and added together.

As shown in FIGS. 2A-2F and FIG. 3, the high resolution shift-and-add operation may include stitching together two or more images by aligning pixels from one low resolution image into corresponding inter-pixel spaces in another low resolution image. For example, as shown in FIG. 2A, a first low resolution image A has pixels $A_1 \ldots A_9$. Adjacent pixels in this image are separated from each other by a characteristic spacing d. For simplicity, it is assumed in this example that the vertical and horizontal spacing are the same. However, in practice, the vertical and horizontal spacing may be different. In embodiments of the invention it is desirable for the spacing d to be at least as large as, or larger than, the probe beam cross-sectional size at the substrate. It is also desirable for the vibration of the substrate to be characterized by an amplitude of a component of vibration parallel to a plane of the substrate that is of the same order as the characteristic spacing d between pixels in the low resolution images. As shown in FIGS. 2B-2D, the vibration of the target may result in second, third and fourth low resolution images B, C and D of the target with pixels obtained from locations on the target that lie in between the pixels that make up the first image A. To enhance the likelihood that this will happen, i.e., to enhance the likelihood of aliasing, it is desirable to obtain the low resolution images at a sample rate that is less than about half as much as a characteristic vibration frequency for a component of the vibration of the substrate parallel to a plane of the substrate.

The pixels from the first second, third and fourth low resolution images A, B, C and D may be interlaced to form an intermediate high resolution image 300 as shown in FIG. 3. Note that in this example, images A, B, C and D are 3×3 pixel images and intermediate image 300 is a 6×6 pixel image. The resolution of the intermediate image 300 is substantially greater than that of the low resolution images A, B, C and D as a result of the fourfold increase in the number of pixels per unit area.

It is noted that some low resolution images may have overlapping pixels, i.e., pixels that lie more or less on top of one another. For example, as shown in FIGS. 2E and 2F, a fifth low resolution image E and a sixth low resolution image F have pixels $E_1 \ldots E_9$ and $F_1 \ldots F_9$, respectively, that lie on top of corresponding pixels $B_1 \ldots B_9$ of the second low resolution image B. To include the pixels from low resolution images B, E, and F into the intermediate high resolution image 300, the high-resolution shift-and-add operation may average overlapping pixels from two or more low resolution images to produce corresponding pixel values for the high resolution image 300. For example, the values (e.g., grey levels) of pixels $B_1$, $E_1$ and $F_1$ may be averaged to determine the value of the pixel in the first row and second column of the intermediate high resolution image 300. Combining the multiple pixels into one can be accomplished by any known signal estimation techniques, such as averaging, or weighted average, or sophisticated adaptive techniques such as Stochastic gradient based algorithms, wiener filters, Kalman filters.

In some embodiments, a point spread function of the microscopy tool may be deconvolved from the intermediate image as indicated at 110 to produce the super resolution image. The point spread function (PSF) defines the propagation of electromagnetic radiation, charged particles or other imaging waves from a point source or point object. As a result of the linearity property, the image of any object in a microscope may be computed by treating the object in parts, imaging each of these, and summing the results. When one divides the object into discrete point objects of varying intensity, the image is computed as a sum of the PSF of each point. The PSF is typically determined entirely by the imaging system (that is, the microscope). Thus, the entire image may be described by knowing the optical properties of the microscope system. This process is usually formulated by a convolution equation. In microscope image processing, knowing the PSF of the measuring device is very important for restoring the (original) image with deconvolution.

In optics and imaging, the term "deconvolution" is specifically used to refer to the process of reversing the optical distortion that takes place in an optical microscope electron microscope, or other imaging instrument, thus creating clearer images. It is usually done in the digital domain by a software algorithm, as part of a suite of microscope image processing techniques. The usual method is to assume that the optical path through the instrument is optically perfect, convolved with a point spread function (PSF), that is, a mathematical function that describes the distortion in terms of the pathway a theoretical point source of charged particles (or other waves) takes through the instrument. Usually, such a point source contributes a small area of fuzziness to the final image. If this function can be determined, it is then a matter of computing its inverse or complementary function, and convolving the acquired image with that. The result is the original, undistorted image.

Figure 4:
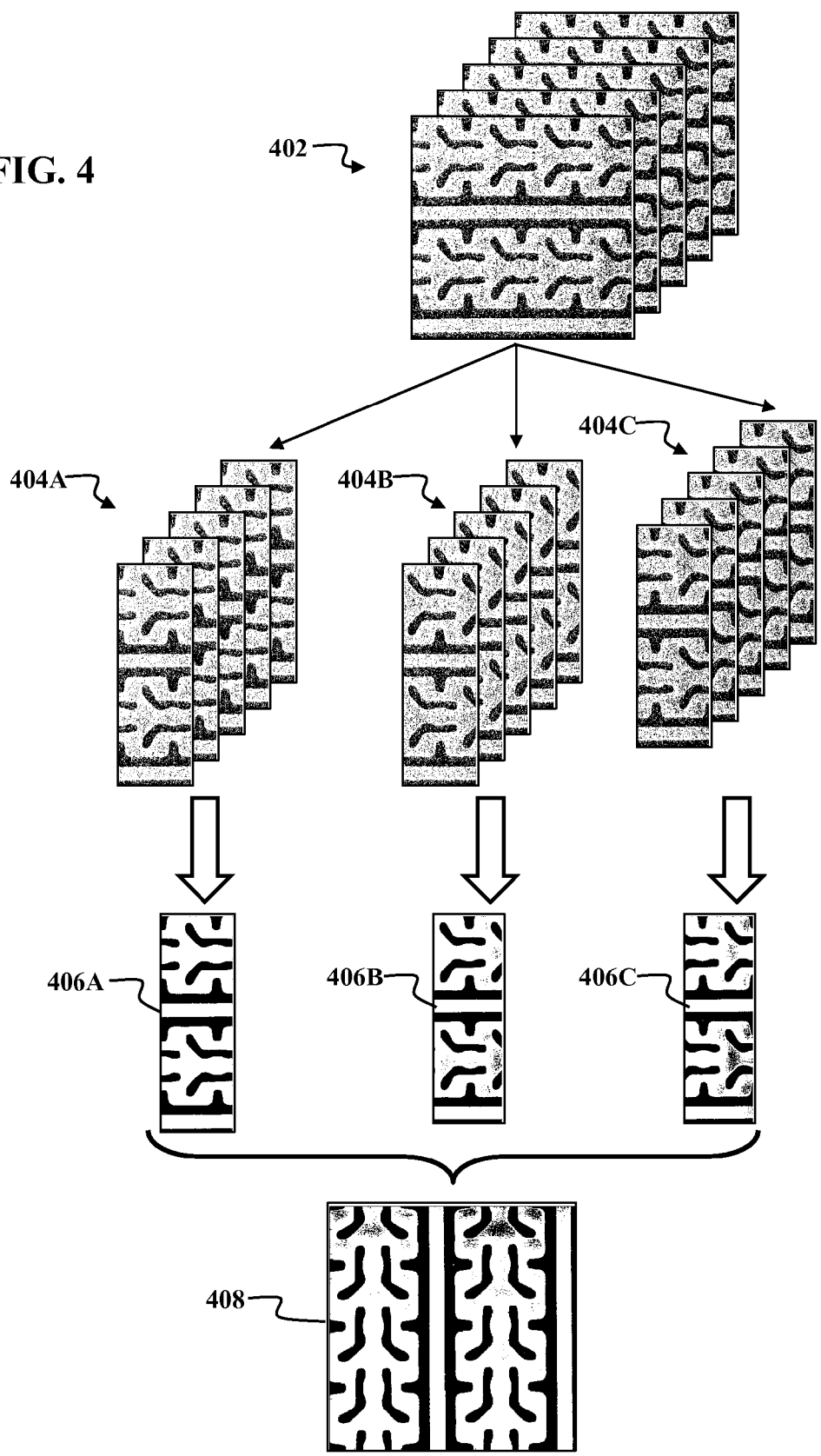
FIG. 4 is a series of images illustrating stitching together a high resolution image from slices of low-resolution images.

In some embodiments of the invention, two or more intermediate high resolution images may be stitched together to form a larger high resolution image. For example, as shown in FIG. 4, a set of individual low resolution images 402 may be divided up into sets of low resolution slices 404A, 404B, 404C. Intermediate super resolution slices 406A, 406B, 406C may be extracted in parallel from the sets of low resolution slices 404A, 404B, 404C, e.g., using the super resolution techniques described above with respect to FIG. 1, FIGS.

2A-2F and FIG. 3. As used herein, the term "extracted in parallel" means that the computational processing used to generate the super resolution slices 406A, 406B and 406C overlap to some degree in time. Each super resolution intermediate slice 404A, 404B, 404C shows a different portion of a target substrate. The intermediate super resolution slices 404A, 404B, 404C may then be stitched together to form a super resolution image 408.

Although dividing up the image into slices may increase the amount of computation, it allows an imaging system to handle high frequency movement of the target being imaged. Higher frequency (higher then the frame collection frequency) Stage vibrations at frequencies higher than the frame collection frequency may cause different slices of the image (top, middle, bottom) to move relative to each other independently of each other. The aligning of slices allows the system to handle higher frequency movement. Dividing up the images is optional based on the nature of the image collection. For example, charge coupled device (CCD) camera's don't suffer from this because the instantaneously collect all the pixels for a frame.

Figure 5A:
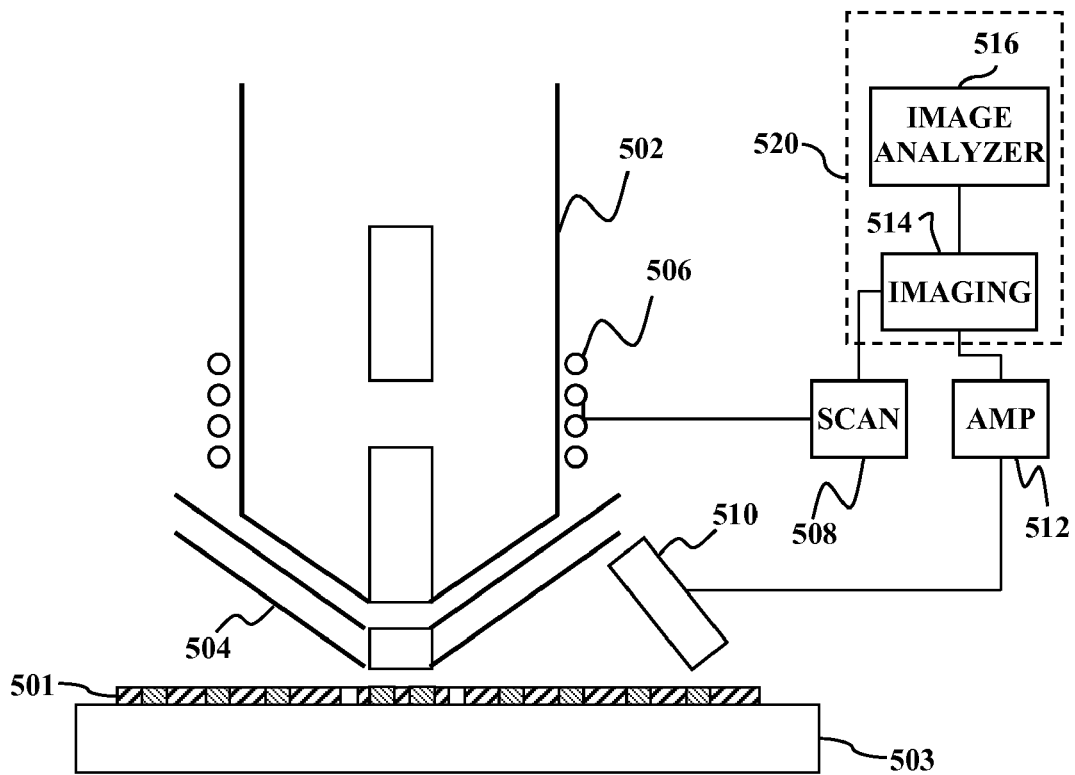
FIG. 5A is a schematic diagram illustrating charged particle beam microscopy tool according to an embodiment of the present invention.
Figure 5B:
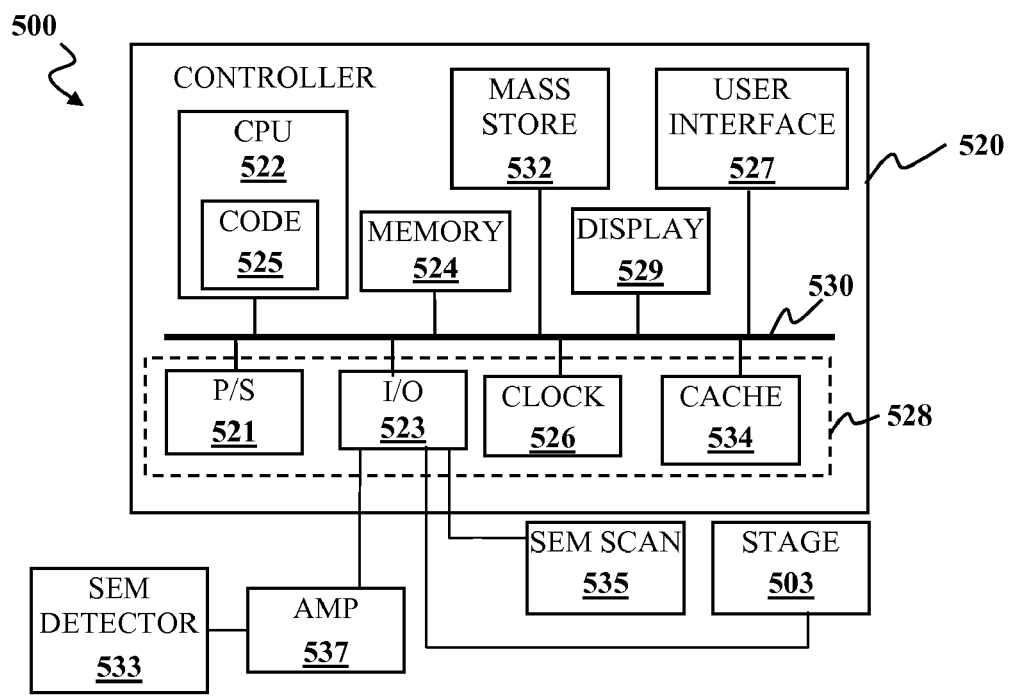
FIG. 5B is a block diagram of the system of FIG. 5A.

FIGS. 5A-5B illustrate an example of a charged particle beam microscopy system 500 adapted for use with embodiments of the present invention. In the example shown in FIG. 5A, the system 500 is an electron beam microscopy system, which generally includes a scanning electron microscope having an electron beam column 502 with an electron source 515, beam optics 535 an immersion lens 504. A target 501 may be mounted to a stage 503. The stage 503 may include translation mechanisms that allow the target to move laterally with respect to the beam column 502 to image different portions of the target 501. The electron beam column 502 may be controlled by electronics 536, referred to herein as an e-beam driver. The e-beam driver 536 may control the electron source 515, beam optics 535 and immersion lens 504.

Electrons from the electron beam column 502 are focused onto a target surface 501, which may be an integrated circuit wafer, test wafer or reticle. The electrons from the beam column 502 are scanned across the surface of the target 501 by magnet deflecting fields provided by one or more scanning coils 506. Current is provided to the coils 506 via a scanner driver 508. Electrons striking the target 501 are either backscattered or initiate secondary emission. Either way a detector 510 generates a signal proportional to the amount of backscattering or secondary emission. The signal may be amplified by an amplifier 512. The amplified signal and a signal from the scanner driver 508 are combined by an image generator 514 to produce a high-contrast, magnified image of the surface of the target 501. The images are analyzed by an image analyzer 516. The image analyzer is adapted to obtain a plurality of low resolution images from the image generator 514 and produce a super resolution image of the surface by extracting the super resolution image from aliasing present in the plurality of low resolution images due to vibration of the substrate. The super resolution image comprises a plurality of pixels from the two or more low resolution images, e.g., as described above with respect to FIG. 1 and FIGS. 2A-2F, FIG. 3 and FIG. 4. Since the super resolution imaging relies on aliasing due to vibration of the stage 503, a much less expensive stage and translation mechanisms may be used.

In general, the use of super resolution imaging allows the mechanical precision built into the stage 503 may be relaxed resulting in a cost reduction. By way of example, in a system that doesn't compensate for movement of the stage, e.g., by super resolution imaging, it is desirable for the stage's vibration amplitude to be less than the size of a pixel to minimize the effect of vibration on resolution. In embodiments of the present invention, by contrast, the stage's dampening at lower vibration frequencies (frequencies below the pixel sampling rate) may allow for vibration amplitude larger than the size of a pixel provided the vibration doesn't effect other features of the frame (such as field of view size). In other words, if the stage keeps the sample of interest within the field that the tool is probing and the vibration frequencies are sufficiently low, embodiments of the invention may take advantage of the vibration through the use of super resolution imaging.

As shown in the block diagram of FIG. 5B, the image generator 514 and image analyzer may be part of a controller 520. The controller 520 may be a self-contained microcontroller. Alternatively, the controller 520 may be a general purpose computer configured to include a central processor unit (CPU) 522, memory 524 (e.g., RAM, DRAM, ROM, and the like) and well-known support circuits 528 such as power supplies 521, input/output (I/O) functions 523, clock 526, cache 534, and the like, coupled to a control system bus 530. The memory 524 may contain instructions that the CPU 522 executes to facilitate the performance of the system 500. The instructions in the memory 524 may be in the form of the program code 525. The code 525 may control, e.g., the electron beam voltage and current produced by the source 515, the focusing of the beam with the beam optics 535 and the immersion lens 504 and the scanning of the electron beam by the coils 506 and the formation of images with the signal from the detector 510 in a conventional fashion. The code 525 may also implement analysis of the images. In particular, the code 525 may include instructions that, when executed, generate a super resolution image from a plurality of low resolution images, e.g., as described above with respect to FIGS. 1, 2A-2F, 3 and 4.

The code 525 may conform to any one of a number of different programming languages such as Assembly, C++, JAVA or a number of other languages. The controller 520 may also include an optional mass storage device, 532, e.g., CD-ROM hard disk and/or removable storage, flash memory, and the like, which may be coupled to the control system bus 530. The controller 520 may optionally include a user interface 527, such as a keyboard, mouse, or light pen, coupled to the CPU 522 to provide for the receipt of inputs from an operator (not shown). The controller 520 may also optionally include a display unit 529 to display images generated by the image generator 514 and/or to provide information to the operator in the form of graphical displays and/or alphanumeric characters under control of the processor unit 522. The display unit 529 may be, e.g., a cathode ray tube (CRT) or flat screen monitor.

The controller 520 may exchange signals with the imaging device scanner driver 508, the e-beam driver 535 and the detector 510 or amplifier 512 through the I/O functions 523 in response to data and program code instructions stored and retrieved by the memory 524. Depending on the configuration or selection of controller 520 the scanner driver 508 and detector 510 or amplifier 512 may interface with the I/O functions via conditioning circuits. The conditioning circuits may be implemented in hardware or software form, e.g., within code 525.

Although the above example describes a scanning electron microscope system, embodiments of the invention may be used in other types of imaging systems, such as laser beam probing systems, focused ion beam systems, scanning tunneling microscope (STM) and atomic force microscope (AFM) systems.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for improving throughput in review of images from a charged particle beam microscopy tool, comprising:
   obtaining a plurality of low resolution images of a surface of a substrate with a charged particle beam microscopy tool;
   producing a super resolution image of the surface by extracting the super resolution image from aliasing present in the plurality of low resolution images due to vibration of the substrate, wherein the super resolution image comprises a plurality of pixels obtained from the two or more low resolution images.

2. The method of claim 1, wherein the charged particle beam microscopy tool includes a stage for supporting the substrate, wherein obtaining the plurality of images includes obtaining the plurality of images without waiting for the stage to settle.

3. The method of claim 1, wherein producing a high resolution image of the surface from plurality of images using a super resolution technique includes:
   aligning one of the images with another image; and
   determining a difference between two or more of the images to produce an intermediate image.

4. The method of claim 3, wherein producing a high resolution image of the surface from plurality of images using a super resolution technique further includes:
   deconvolving a point spread function of the microscopy tool from the intermediate image.

5. The method of claim 3 wherein determining a difference between two or more of the images includes performing a high resolution shift-and-add operation involving two or more of the images.

6. The method of claim 5 wherein the high resolution shift-and-add operation includes interlacing together two or more images by aligning pixels from one low resolution image into corresponding inter-pixel spaces in another low resolution image.

7. The method of claim 6 wherein the high-resolution shift-and-add operation includes averaging overlapping pixels from two or more low resolution images.

8. The method of claim 1 wherein the obtaining a plurality of low resolution images of a surface of a substrate with a charged particle beam microscopy tool includes probing the surface of the substrate with a probe beam of charged particles, wherein the probe beam has a cross-sectional size at the target that is less than a characteristic size of the pixels that make up the super resolution image.

9. The method of claim 1 wherein vibration of the substrate is characterized by an amplitude of a component of vibration parallel to a plane of the substrate that is of the same order as a characteristic spacing between pixels in the low resolution images.

10. The method of claim 1 wherein obtaining a plurality of low resolution images of a surface of a substrate with a charged particle beam microscopy tool includes obtaining the images at a sample rate that is less than a characteristic vibration frequency for a component of the vibration of the substrate parallel to a plane of the substrate.

11. The method of claim 1, wherein producing a super resolution image of the surface by extracting the super resolution image from aliasing present in the plurality of low resolution images includes:
   dividing up two or more of the low resolution images into two or more sets of low resolution slices;
   extracting two or more intermediate resolution slices in parallel from aliasing present in the two or more sets of low resolution slices due to vibration of the substrate; and
   stitching together the two or more intermediate resolution slices to form the super resolution image.

12. A charged particle beam microscopy tool, comprising:
   a source of a charged particle beam;
   charged particle optics adapted to focus the charged particle beam onto a substrate;
   a detector adapted to detect secondary charged particles produced by interaction between the charged particle beam and the substrate;
   an image generator coupled to the detector, the image generator being adapted to produce one or more low resolution images based on the detection of the secondary charged particles by the detector; and
   an image analyzer, wherein the image analyzer is adapted to
      obtain a plurality of low resolution images from the image generator; and
      produce a super resolution image of the surface by extracting the super resolution image from aliasing present in the plurality of low resolution images due to vibration of the substrate, wherein the super resolution image comprises a plurality of pixels from the two or more low resolution images.

13. The charged particle beam microscopy tool of claim 12 wherein the source of the charged particle beam is an electron beam source.

14. The charged particle beam microscopy tool of claim 12, further comprising a stage for supporting the substrate.

15. The charged particle beam microscopy tool of claim 14 wherein the image analyzer obtains the plurality of images includes obtaining the plurality of images without waiting for the stage to settle.

16. The charged particle beam microscopy tool of claim 14 wherein vibration of the stage is characterized by an amplitude of a component of vibration parallel to a plane of the substrate that is of the same order as a characteristic spacing between adjacent pixels in the low resolution images.

17. The charged particle beam microscopy tool of claim 14 wherein the vibration of the stage is characterized by an amplitude that is greater than a size of the pixels and less than a field of view of the charged particle beam microscopy tool.

18. The charged particle beam microscopy tool of claim 12 wherein the image analyzer is adapted to produce the high resolution image of the surface from the plurality of images using a super resolution technique by:
   aligning one of the images with another image; and
   determining a difference between two or more of the images to produce an intermediate image.

19. The charged particle beam microscopy tool of claim 18 wherein the image analyzer is adapted to deconvolve a point spread function of the microscopy tool from the intermediate image.

20. The charged particle beam microscopy tool of claim 18 wherein determining a difference between two or more of the images includes performing a high resolution shift-and-add operation involving two or more of the images.

21. The charged particle beam microscopy tool of claim 20 wherein the high resolution shift-and-add operation includes interlacing together two or more images by aligning pixels from one low resolution image into corresponding inter-pixel spaces in another low resolution image.

22. The charged particle beam microscopy tool of claim 21 wherein the high-resolution shift-and-add operation includes averaging overlapping pixels from two or more low resolution images.

23. The charged particle beam microscopy tool of claim 12, wherein the charged particle beam has a cross-sectional size at the target that is less than a characteristic size of the pixels that make up the super resolution image.

24. The charged particle beam microscopy tool of claim 12 wherein the image analyzer is adapted to obtain the low resolution images at a sample rate that is less than a characteristic vibration frequency for a component of the vibration of the substrate parallel to a plane of the substrate.

25. The charged particle beam microscopy tool of claim 12 wherein the image analyzer is adapted to produce the super resolution image of the surface by:

dividing up two or more of the low resolution images into two or more sets of low resolution slices;

extracting two or more intermediate resolution slices in parallel from aliasing present in the two or more sets of low resolution slices due to vibration of the substrate; and stitching together the two or more intermediate resolution slices to form the super resolution image.

\* \* \* \* \*